United States Patent
May et al.

(10) Patent No.: US 9,793,484 B2
(45) Date of Patent: Oct. 17, 2017

(54) COMPOSITION COMPRISING POLYMERIC ORGANIC SEMICONDUCTING COMPOUNDS

(71) Applicant: Merck Patent GmbH, Darmstadt (DE)

(72) Inventors: Philip Edward May, Sidcup (GB); Mark James, Romsey (GB); Susanne Heun, Bad Soden (DE); Katie Court, Eastleigh (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 14/655,922

(22) PCT Filed: Dec. 6, 2013

(86) PCT No.: PCT/EP2013/003694
§ 371 (c)(1),
(2) Date: Jun. 26, 2015

(87) PCT Pub. No.: WO2014/101981
PCT Pub. Date: Jul. 3, 2014

(65) Prior Publication Data
US 2016/0197280 A1    Jul. 7, 2016

(30) Foreign Application Priority Data

Dec. 28, 2012 (EP) .................................. 12008649

(51) Int. Cl.
| | | |
|---|---|---|
| H01L 51/00 | (2006.01) | |
| C09D 11/52 | (2014.01) | |
| H01L 51/05 | (2006.01) | |
| H01L 51/42 | (2006.01) | |
| H01L 51/50 | (2006.01) | |

(52) U.S. Cl.
CPC .......... *H01L 51/0035* (2013.01); *C09D 11/52* (2013.01); *H01L 51/0007* (2013.01); *H01L 51/0043* (2013.01); *H01L 51/0039* (2013.01); *H01L 51/0541* (2013.01); *H01L 51/0545* (2013.01); *H01L 51/0558* (2013.01); *H01L 51/42* (2013.01); *H01L 51/5012* (2013.01); *Y02E 10/549* (2013.01); *Y02P 70/521* (2015.11)

(58) Field of Classification Search
CPC ............. H01L 51/0035; H01L 51/0007; H01L 51/0043; H01L 51/0541; H01L 51/0039; H01L 51/0545; H01L 51/42; H01L 51/0558; H01L 51/5012; C09D 11/52; Y02E 10/549; Y02P 70/521
USPC ............................... 252/500; 257/40; 438/99
See application file for complete search history.

(56) References Cited

U.S. PATENT DOCUMENTS

| | | | |
|---|---|---|---|
| 6,994,893 B2 | 2/2006 | Spreitzer et al. | |
| 8,038,903 B2 * | 10/2011 | Spreitzer | C09K 11/06 136/263 |
| 8,974,702 B2 * | 3/2015 | May | C09D 5/24 252/500 |
| 9,368,761 B2 * | 6/2016 | James | H01L 51/0003 |
| 2004/0225056 A1 * | 11/2004 | Spreitzer | C09K 11/06 524/570 |
| 2006/0127592 A1 * | 6/2006 | Spreitzer | C09K 11/06 427/469 |
| 2007/0215864 A1 | 9/2007 | Luebben et al. | |
| 2008/0199600 A1 * | 8/2008 | Spreitzer | C09K 11/06 427/125 |
| 2008/0226941 A1 * | 9/2008 | Becker | H01L 51/0007 428/690 |
| 2011/0204345 A1 | 8/2011 | Kakimoto | |
| 2011/0269255 A1 * | 11/2011 | Goddard | H01L 51/0007 438/46 |
| 2012/0256137 A1 * | 10/2012 | James | H01L 51/0003 252/500 |
| 2012/0273736 A1 * | 11/2012 | James | C09D 5/24 252/519.21 |
| 2013/0149812 A1 * | 6/2013 | Newsome | H01L 51/0007 438/99 |

FOREIGN PATENT DOCUMENTS

| | | | | |
|---|---|---|---|---|
| CN | 102668151 A | 9/2012 | | |
| DE | WO 2011128035 A1 * | 10/2011 | ......... | H01L 51/0007 |
| GB | WO 2011076380 A1 * | 6/2011 | ............... | C09D 5/24 |
| GB | 2482974 A | 2/2012 | | |
| WO | WO-02072714 A1 | 9/2002 | | |
| WO | WO-2010010337 A1 | 1/2010 | | |
| WO | WO-2011147523 A1 | 12/2011 | | |

OTHER PUBLICATIONS

International Search Report for PCT/EP2013/003694 mailed Mar. 6, 2014.

* cited by examiner

*Primary Examiner* — Douglas McGinty

(57) ABSTRACT

The present invention relates to novel compositions comprising one or more polymeric organic semiconducting (OSC) compounds and one or more organic solvents. The composition preferably comprises 3,4-dimethyl anisole as solvent. Furthermore, the present invention describes the use of these compositions as inks for the preparation of organic electronic (OE) devices, especially organic photovoltaic (OPV) cells and organic light emitting diodes (OLED) devices, to methods for preparing OE devices using the novel formulations, and to OE devices, OLED devices and OPV cells prepared from such methods and formulations.

16 Claims, 2 Drawing Sheets

Figure 1A:
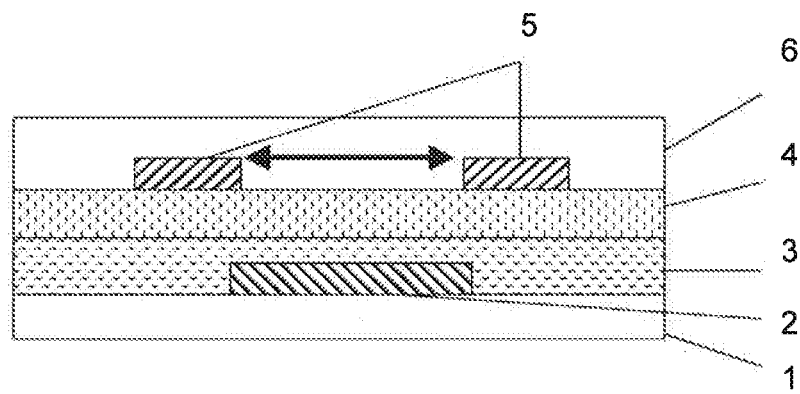

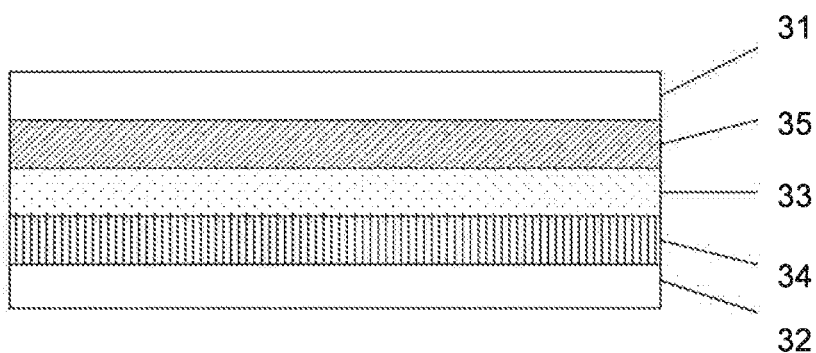
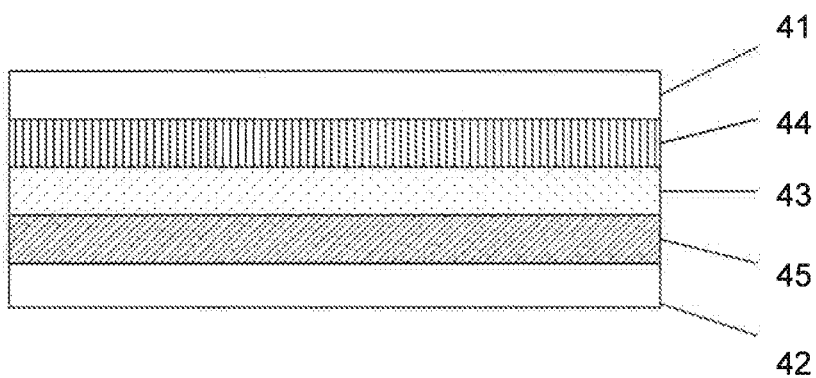

COMPOSITION COMPRISING POLYMERIC ORGANIC SEMICONDUCTING COMPOUNDS

CROSS-REFERENCE TO RELATED APPLICATIONS

This application is a national stage application (under 35 U.S.C. §371) of PCT/EP2013/003694, filed Dec. 6, 2013, which claims benefit of European Application No. 12008649.1, filed Dec. 28, 2012, both of which are incorporated herein by reference in their entirety.

FIELD OF THE INVENTION

The present invention relates to novel compositions comprising one or more polymeric organic semiconducting compounds (OSC) and one or more organic solvents, to their use as conducting inks for the preparation of organic electronic (OE) devices, especially organic photovoltaic (OPV) cells and organic light emitting diodes (OLED) devices, to methods for preparing OE devices using the novel compositions, and to OE devices, as well as OPV cells and OLED devices prepared from such methods and compositions.

BACKGROUND AND PRIOR ART

When preparing OE devices, especially OLED devices, it is essential to get even film formation, as a 3% variation in film thickness is visible to the naked eye. This is commonly very difficult to achieve. Frequently poor uniformity is seen, this can take the form of coffee staining where the ink is thicker at the edges and thinner in the centre; reticulation where the ink coalesces into large droplets; point defects where small holes appear within the surface of the film. In dual solvent systems Marangoni effects can also been seen.

US 2007/0221885 relates to a three solvent system and is specifically relating to one solvent used to solubilise the active material, a second solvent that has a similar surface energy to the substrate and a third solvent which is used to make the other two solvents miscible. 3,4-dimethylanisole is mentioned within a list of solvents as a potential material to be used, it is not exemplified as one of the solvents. The main drive for this patent is to obtain printability onto low surface energy substrates.

WO 2006/122732 relates to compositions, especially solutions, of at least one organic semiconductor emitting light from the triplet state, in an organic solvent or solvent mixture. The solvent may include 3,4-dimethylanisole. However, no example is provided.

Furthermore WO 2011/076325 A1 describes the use of dimethylanisole as a solvent. However, the solvent is used for small molecules having a molecular weight of at most 5,000 g/mol. No hints regarding OE devices which comprise polymers as OSC materials are provided.

The prior art provides compositions being useful in order to process organic light emitting and charge transporting materials. However, it is a permanent desire to improve the performance of the OE layer, preferably the OLED layer, such as efficiency, lifetime and sensitivity regarding oxidation or water.

In addition thereto, the formulation should enable a low-cost and easy printing process. The printing process should allow a high quality printing at high speed.

It is therefore desirable to have improved formulations comprising an OSC that are suitable for the preparation of OE devices, especially thin film transistors, diodes, OLED displays and OPV cells, which allow the manufacture of high efficient OE devices having a high performance, a long lifetime and a low sensitivity against water and/or oxidation. One aim of the present invention is to provide such improved formulations. Another aim is to provide improved methods of preparing an OE device from such formulations. Another aim is to provide improved OE devices obtained from such formulations and methods. Further aims are immediately evident to the person skilled in the art from the following description.

Surprisingly it has been found that these aims can be achieved, and the above-mentioned problems can be solved, by providing methods, materials and devices as claimed in the present invention, especially by providing a process for preparing an OE device using a formulation of the present invention.

SUMMARY OF THE INVENTION

The invention relates to a composition comprising one or more organic semiconducting compounds (OSC) having a molecular weight of at least 10,000 g/mol, and one or more organic solvents, characterized in that said organic solvent comprises a mono- or di-($C_1$-$C_5$-alkyl)anisole, preferably a di($C_1$-$C_3$-alkyl)anisole, more preferably a dimethylanisole and most preferably 3,4-dimethylanisole.

The invention further relates to the use of a composition as described above and below as coating or printing ink for the preparation of OE devices, preferably OLED devices, in particular for rigid and flexible OLED devices.

The invention further relates to a process of preparing an organic electronic (OE) device, comprising the steps of
a) depositing the composition as described above and below onto a substrate to form a film or layer, preferably by coating or printing, more preferably by ink jet printing, flexographic or gravure printing, most preferably by ink jet printing and
b) removing the solvent(s).

The invention further relates to an OE device, preferably an OLED device, prepared from a formulation and/or by a process as described above and below.

The OE devices include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laserdiodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

According to a preferred embodiment, the present invention provides organic light emitting diodes (OLED). OLED devices can for example be used for illumination, for medical illumination purposes, as signalling devices, as signage devices, and in displays. Displays can be addressed using passive matrix driving, total matrix addressing or active matrix driving. Transparent OLEDs can be manufactured by using optically transparent electrodes. Flexible OLEDs are assessable through the use of flexible substrates.

The formulations, methods and devices of the present invention provide surprising improvements in the efficiency of the OE devices and the production thereof. Unexpectedly, the performance, the lifetime and the efficiency of the OE devices can be improved, if these devices are achieved by using a composition of the present invention. Furthermore, it was surprisingly found that these formulations are suitable for printing techniques, especially for ink jet, flexographic and gravure printing. Furthermore, the composition of the present invention provides an astonishingly high level of film forming. Especially, the homogeneity and the quality of the films can be improved. In addition thereto, the formulations enable a low-cost and easy printing process. The printing processes allow a high quality printing at high speed.

A BRIEF DESCRIPTION OF THE FIGURES

FIG. 1A exemplarily and schematically depicts a typical bottom gate (BG), top contact (TC) OFET device according to the present invention, comprising a substrate (1), a gate electrode (2), a layer of dielectric material (3) (also known as gate insulator layer), an OSC layer (4), and source and drain (S/D) electrodes (5), and an optional passivation or protection layer (6).

Figure 1B:
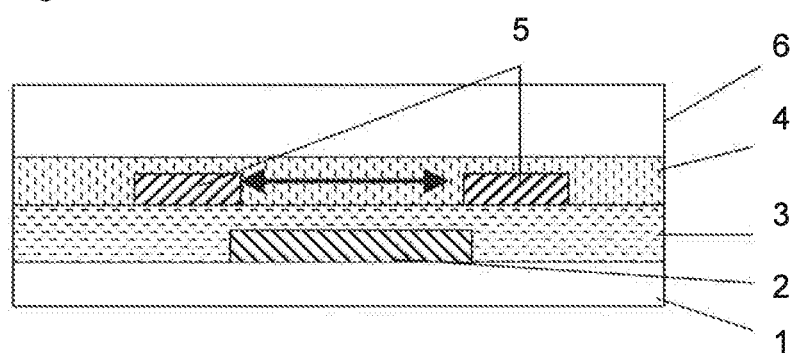

FIG. 1B exemplarily and schematically depicts a typical bottom gate (BG), bottom contact (BC) OFET device according to the present invention, comprising a substrate (1), a gate electrode (2), a dielectric layer (3), S/D electrodes (5), an OSC layer (4), and an optional passivation or protection layer (6).

Figure 2:
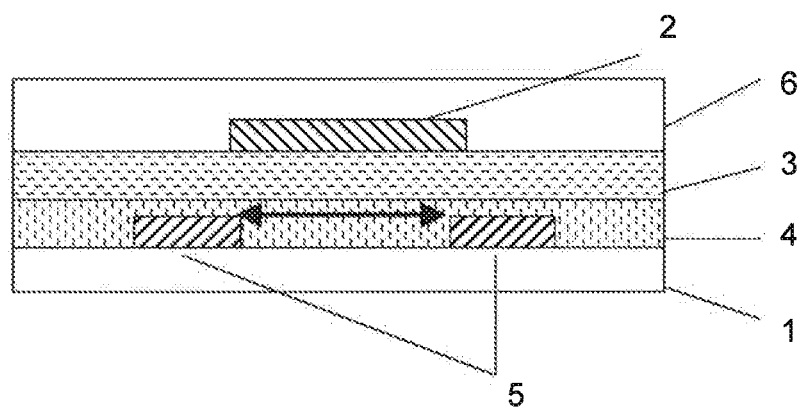

FIG. 2 exemplarily and schematically depicts a top gate (TG) OFET device according to the present invention, comprising a substrate (1), source and drain electrodes (5), an OSC layer (4), a dielectric layer (3), and a gate electrode (2), and an optional passivation or protection layer (6).

FIG. 3 exemplarily and schematically depict typical and preferred OPV devices according to the present invention.

FIG. 4 exemplarily and schematically depict typical and preferred OPV devices according to the present invention.

DETAILED DESCRIPTION OF THE INVENTION

The formulation of the present invention comprises at least one polymeric organic semiconducting compound (OSC). The OSC compounds can be selected from standard materials known to the skilled person and described in the literature.

OLEDs which comprise polymers as organic materials are frequently also known as PLEDs (PLED=polymeric light emitting diodes). Their simple production holds the promise of inexpensive production of corresponding electroluminescent devices.

PLEDs consist either only of one layer, which is able to combine as far as possible all functions (charge injection, charge transport, recombination) of an OLED in itself, or they consist of a plurality of layers which comprise the respective functions individually or partially combined. For the preparation of polymers having the corresponding properties, the polymerisation is carried out using different monomers which take on the corresponding functions.

The organic semiconducting compound has a molecular weight of at least 10,000 g/mol, preferably at least 20,000 g/mol, more preferably at least 50,000 g/mol and most preferably at least 100,000 g/mol. Surprising effects can be achieved with organic semiconducting compounds having a molecular weight in the range of 10,000 to 20,000,000 g/mol, preferably in the range of 20,000 to 10,000,000 g/mol, more preferably in the range of 50,000 to 5,000,000 g/mol and most preferably in the range of 100,000 to 2,000,000 g/mol. The molecular weight of the organic semiconducting compound relates to the weight average. The weight average molecular weight $M_w$ can be measured by standard methods such as gel permeation chromatography (GPC) against polystyrene standards.

In the present application, the term "polymer" is taken to mean both polymeric compounds and dendrimers. The polymeric compounds according to the invention preferably have 10 to 10,000, more preferably 20 to 5,000 and in most preferably 50 to 2,000 structural units. The branching factor of the polymers here is between 0 (linear polymer, no branching sites) and 1 (fully branched dendrimer).

In a preferred embodiment of the present invention, the polymers useful for the invention may contain structural units as disclosed and listed extensively in WO 02/077060 A1, in WO 2005/014689 A2 and in WO 2010/136110 A2. These are incorporated into the present application by way of reference. The further structural units can originate, for example, from the following classes:

Group 1: Units which influence, preferably enhance, the hole-injection and/or hole-transport properties of the polymers;

Group 2: Units which influence, preferably enhance, the electron-injection and/or electron-transport properties of the polymers;

Group 3: Units which have combinations of individual units from group 1 and group 2;

Group 4: Units which modify the emission characteristics to such an extent that electrophosphorescence can be obtained instead of electrofluorescence;

Group 5: Units which improve transfer from the singlet state to the triplet state;

Group 6: Units which influence the emission colour of the resultant polymers;

Group 7: Units which are typically used as backbone;

Group 8: Units which influence the film-morphological and/or rheological properties of the resultant polymers.

Preferred polymers according to the invention are those in which at least one structural unit has charge-transport properties, i.e. which contain units from groups 1 and/or 2.

Structural units from group 1 which have hole-injection and/or hole-transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −1.9 eV (against vacuum level), particularly preferably less than −2.5 eV.

It may be preferred for the polymers according to the present invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4, so-called triplet emitter units, are those which are able to emit light from the triplet state with high efficiency, even at room temperature, i.e. exhibit electrophosphorescence instead of electrofluorescence, which frequently causes an increase in the energy efficiency. For the purposes of the present application, a triplet emitter unit is taken to mean a compound which comprises a triplet emitter. For the purposes of the present application, triplet emitters are taken to mean all compounds which are capable of emitting light in the visible or NIR region through transfer from a triplet state into an energetically lower state. This is also referred to as phosphorescence. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1 and EP 1239526 A2. Corresponding monomers are described in WO 02/068435 A1 and in WO 2005/042548 A1.

It is preferred in accordance with the present invention to employ triplet emitters which emit in the visible spectral region (red, green or blue).

The triplet emitter may be part of the backbone of the polymer (i.e. in the main chain of the polymer) or it may be located in the side chain of the polymer.

Structural units from group 5 are those which improve transfer from the singlet state to the triplet state and which, employed in support of the above-mentioned triplet emitter units, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, but in principle also all similar structures which, after polymerisation, would result in a conjugated, bridged or unbridged polyphenylene or polyphenylene-vinylene homopolymer. Here too, the said aromatic structure may contain heteroatoms, such as O, S or N, in the backbone or the side chain.

Structural units from group 8 are those which influence the film-morphological properties and/or the rheological properties of the polymers, such as, for example, siloxanes, long alkyl chains or fluorinated groups, but also particularly rigid or flexible units, such as, for example, liquid crystal-forming units or crosslinkable groups.

The synthesis of the above-described units from groups 1 to 8 and of the further emitting units is known to the person skilled in the art and is described in the literature, for example in WO 2005/014689 A2, WO 2005/030827 A1, WO 2005/030828 A1 and WO 2010/136110 A2. These documents and the literature cited therein are incorporated into the present application by way of reference.

The polymers useful for the present invention may contain one or more units selected from groups 1 to 8. It may furthermore be preferred for more than one structural unit from one group to be present simultaneously.

The way in which white-emitting copolymers can be synthesised is described in detail, for example, in WO 2005/030827 A1, WO 2005/030828 A1 and WO 2010/136110 A2.

Astonishing improvements can be achieved with one or more polymeric organic semiconducting compounds having a high solubility. Preferred polymeric organic semiconducting compounds can comprise Hansen Solubility parameters of $H_d$ in the range of 17.0 to 20.0 $MPa^{0.5}$, $H_p$ in the range of 2 to 10.0 $MPa^{0.5}$ and $H_h$ in the range of 0.0 to 15.0 $MPa^{0.5}$. More preferred organic semiconducting compounds comprise Hansen Solubility parameters of $H_d$ in the range of 17.5 to 19.0 $MPa^{0.5}$, $H_p$ in the range of 3.5 to 8.0 $MPa^{0.5}$ and $H_h$ in the range of 3.0 to 10.0 $MPa^{0.5}$.

Surprising effects can be achieved with organic semiconducting compounds having a radius of at least 3.0 $MPa^{0.5}$, preferably at least 4.5 $MPa^{0.5}$ and more preferably at least 5.0 $MPa^{0.5}$ determined according to Hansen Solubility parameters.

The Hansen Solubility Parameters can be determined according to the Hansen Solubility Parameters in Practice HSPiP $3^{rd}$ edition, (Software version 3.0.38) with reference to the Hansen Solubility Parameters: A User's Handbook, Second Edition, C. M. Hansen (2007), Taylor and Francis Group, LLC) as supplied by Hanson and Abbot et al.

The positions $H_d$, $H_p$ and $H_h$ are the coordinates in 3 dimensional space for the centre of the organic semiconducting compound, whilst the radius, gives the distance that the solubility extends, i.e. if the radius is large it will encompass more solvents that would dissolve the material and conversely if it was small then a restricted number of solvents would solubilise the organic semiconducting compound.

According to a special aspect of the present invention the organic semiconducting compound may comprise a high glass transition temperature. Preferably, the organic semiconducting compound may have a glass transition temperature preferably of at least 70° C., more preferably of at least 100° C. and most preferably of at least 125° C. determined according to DIN 51005.

According to a special embodiment of the present invention, the OSC can be used for example as the active channel material in the semiconducting channel of an OFET, or as a layer element of an organic rectifying diode.

In case of OFET devices, where the OFET layer contains an OSC as the active channel material, it may be an n- or p-type OSC. The semiconducting channel may also be a composite of two or more OSC compounds of the same type, i.e. either n- or p-type. Furthermore, a p-type channel OSC compound may for example be mixed with an n-type OSC compound for the effect of doping the OSC layer. Multilayer semiconductors may also be used. For example, the OSC may be intrinsic near the insulator interface and a highly doped region can additionally be coated next to the intrinsic layer.

Preferred OSC compounds have a FET mobility of greater than $1 \times 10^{-5}$ cm$^2$V$^{-1}$ s$^{-1}$, more preferably greater than $1 \times 10^{-2}$ cm$^2$ V$^{-1}$ s$^{-1}$.

According to a preferred embodiment of the present invention the OSC material is an organic light emitting material and/or charge transporting material. The organic light emitting materials and charge transporting materials can be selected from standard materials known to the skilled person and described in the literature. Organic light emitting material according to the present application means a material which emits light having a $\lambda_{max}$ in the range from 400 to 700 nm.

According to a special embodiment of the present invention, the composition preferably comprises 0.1 to 10% by weight, more preferably 0.25 to 5% and most preferably 0.5 to 4% by weight of organic semiconducting compounds having a molecular weight of at least 10,000 g/mol, preferably emitting materials and/or charge transporting materials.

It may additionally be preferred to use the organic semiconducting compounds (OSC) having a molecular weight of at least 10,000 g/mol not as the pure substance, but instead as a mixture together with further polymeric, oligomeric, dendritic or low-molecular-weight substances of any desired type. These may, for example, improve the electronic properties or themselves emit. Above and below, a mixture is taken to mean a composition which comprises at least one polymeric component.

In a further embodiment of the present invention, it is preferred for a mixture to comprise an organic semiconducting compound (OSC) having a molecular weight of at least 10,000 g/mol and a low-molecular-weight substance. The low-molecular-weight substance is preferably a triplet emitter.

In a further embodiment, it is preferred for the organic semiconducting compounds (OSC) having a molecular weight of at least 10,000 g/mol to be employed in an emitting layer together with an emitting compound having a low molecular weight. In this case, the polymer is preferably employed in combination with one or more phosphorescent materials (triplet emitters). For the purposes of the present application, phosphorescence is taken to mean the luminescence from an excited state of relatively high spin multiplicity, i.e. a spin state>1, in particular from an excited triplet state or from an MLCT mixed state. The mixture comprising the organic semiconducting compounds (OSC) having a molecular weight of at least 10,000 g/mol and the emitting compound then comprises between 99 and 1% by weight, preferably between 98 and 60% by weight, more preferably between 97 and 70% by weight, and most preferably between 95 and 75% by weight, of the organic semiconducting compounds (OSC) having a molecular weight of at least 10000 g/mol, based on the entire mixture comprising emitter and matrix material. Correspondingly, the mixture comprises up to 99% by weight, preferably up to 40% by weight, more preferably up to 30% by weight and most preferably up to 25% by weight, of the emitter, based on the entire mixture comprising emitter and matrix material. In addition, the mixture comprises at least 1% by weight, preferably at least 2% by weight, more preferably at least 3% by weight and most preferably at least 5% by weight, of the emitter, based on the entire mixture comprising emitter and matrix material.

In the above-mentioned embodiment in which the organic semiconducting compounds (OSC) having a molecular weight of at least 10,000 g/mol is employed in an emitting layer together with an emitting compound, the proportion of the emitting compound may, however, also be significantly lower. In this case, the mixture preferably comprises at least 0.01% by weight of the emitter, based on the entire mixture, but preferably less than 5% by weight, more preferably less than 3% by weight and most preferably less than 1.5% by weight of the emitter, based on the entire mixture.

Suitable phosphorescent compounds are, in particular, compounds which emit light, preferably in the visible region, on suitable excitation and in addition contain at least one atom having an atomic number of greater than 36 and less than 84, preferably greater than 56 and less than 80.

Examples of the emitters described above are revealed by the applications WO 00/70655, WO 01/41512, WO 02/02714, WO 02/15645, EP 1191613, EP 1191612, EP 1191614, WO 05/033244 and DE 102008015526. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without an inventive step.

In a further embodiment according to the invention, the triplet emitter preferably contains an organometallic connecting unit. The organometallic connecting unit is preferably an organometallic coordination compound. In the present application, an organometallic coordination compound is taken to mean a compound having a metal atom or ion in the centre of the compound surrounded by an organic compound as ligand. In addition, an organometallic coordination compound is characterised in that at least one carbon atom of the ligand is bonded to the central metal via a coordination bond. Electrically neutral triplet emitters are furthermore preferred.

The triplet emitters preferably contain only chelating ligands, i.e. ligands which coordinate to the metal via at least two bonding sites; the use of two or three bidentate ligands, which may be identical or different, is particularly preferred. The preference for chelating ligands is due to the higher stability of chelate complexes.

Particularly preferred organic phosphorescent compounds are compounds of formulae (1) to (4):

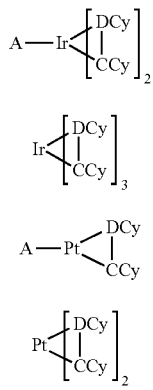

formula (1)
formula (2)
formula (3)
formula (4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a mono-anionic, bidentate chelating ligand, preferably a diketonate ligand;

$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and $R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^1$ radicals.

Formation of ring systems between a plurality of radicals $R^1$ means that a bridge may also be present between the groups DCy and CCy. Further-more, formation of ring systems between a plurality of radicals $R^1$ means that a bridge may also be present between two or three ligands CCy-DCy or between one or two ligands CCy-DCy and the ligand A, giving a polydentate or polypodal ligand system.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973, DE 102008027005 and WO 2011/076325 A1. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, it is known to the person skilled in the art which phosphorescent complexes emit with which emission colour.

The composition of the present invention comprises a mono- or di-($C_1$-$C_5$-alkyl)anisole, preferably a di-($C_1$-$C_3$-alkyl)anisole, more preferably a dimethylanisole and most preferably 3,4-dimethylanisole.

In addition thereto, the composition may comprise a further solvent. By using an additional solvent an astonishing improvement in solubility can be obtained. Obtaining the correct balance of evaporation rate and boiling point is essential in order to maintain solubility whilst drying. Preferably, tetra methyl benzene, more preferably 1,2,4,5 tetra methyl benzene can be used as additional solvent.

Preferred further organic solvents comprise Hansen Solubility parameters of $H_d$ in the range of 16.0 to 23.2 $MPa^{0.5}$, $H_p$ in the range of 0.0 to 12.5 $MPa^{0.5}$ and $H_h$ in the range of 0.0 to 14.2 $MPa^{0.5}$. More preferred organic solvents comprise Hansen Solubility parameters of $H_d$ in the range of 17.0 to 20.0 $MPa^{0.5}$, $H_p$ in the range of 0.0 to 8.0 $MPa^{0.5}$ and $H_h$ in the range of 0.0 to 9.0 $MPa^{0.5}$.

Preferably the further solvent has a boiling point or sublimation temperature of ≤400° C., preferably ≤300° C., more preferably ≤250° C., and most preferably ≤200° C., at the pressure employed, very preferably at atmospheric pressure (1013 hPa). Evaporation can also be accelerated e.g. by applying heat and/or reduced pressure. Unexpected improvements can be achieved by using solvents having a boiling point of at least 100° C., preferably at least 130° C.

Usually, the further organic solvent comprises a surface tension preferably in the range of 15 to 80 mN/m, more preferably in the range of 20 to 60 mN/m and most preferably in the range of 25 to 40 mN/m. The surface tension can be measured using a FTA (First Ten Angstrom) 1000 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

For the purpose for making a rough estimate, the surface tension can be calculated using the Hansen Solubility Parameters by the formula expounded in Hansen Solubility Parameters: A User's Handbook, Second Edition, C. M. Hansen (2007), Taylor and Francis Group, LLC (HSPiP manual).

$$\text{Surface tension} = 0.0146 \times (2.28 \times \delta H_d^2 + \delta H_p^2 + \delta H_h^2) \times MVol^{0.2},$$

where:
$H_d$ refers to Dispersion contribution
$H_p$ refers to Polar contribution
$H_h$ refers to Hydrogen bonding contribution and
MVol refers to Molar Volume.

The Hansen Solubility Parameters can be determined according to the Hansen Solubility Parameters in Practice HSPiP $3^{rd}$ edition, (Software version 3.0.38) with reference to the Hansen Solubility Parameters: A User's Handbook, Second Edition, C. M. Hansen (2007), Taylor and Francis Group, LLC) as supplied by Hanson and Abbot et al.

Preferably, the solvent or the solvent blend has a viscosity in the range of 1.0 to 100 mPas, preferably in the range of 1.2 to 10 mPas, more preferably in the range of 1.3 to 10 mPas and most preferably in the range of 1.4 to 8 mPas. The viscosity is determined at a temperature of 25° C. by measuring on AR-G2 rheometer manufactured by TA Instruments. This measurement can be done over a shear range of 10 to 1000 s$^{-1}$ using 40 mm parallel plate geometry.

Preferably, the further solvent comprises a relative evaporation rate (Butyl acetate=100) of at least 0.01, preferably of at least 0.1, more preferably of at least 1, and most preferably of at least 2. The relative evaporation rate can be determined according to DIN 53170:2009-08. For the purpose for making a rough estimate, the relative evaporation rate can be calculated using the Hansen Solubility Parameters with the HSPiP program as mentioned above and below.

Preferably, the solvent useful for the present invention comprises at least 40% by weight, preferably at least 60% by weight, more preferably at least 75% by weight and most preferably 100% by weight dimethylanisole, and preferably the 3,4 dimethylanisole.

Preferably, the solvent comprises at most 60% by weight, preferably at most 40% by weight and more preferably at most 25% by weight of a further organic solvent compound.

The composition of the present invention particularly comprises at least 70% by weight, preferably at least 80% by weight and more preferably at least 90% by weight of organic solvents.

Preferably, the composition of the present invention comprises at least 40% by weight, preferably at least 60% by weight, more preferably at least 75% by weight and most preferably 100% by weight dimethylanisole, and preferably the 3,4 dimethylanisole.

Preferably, the composition has a viscosity in the range of 1.0 to 100 mPas, preferably in the range of 1.2 to 40 mPas, more preferably in the range of 1.4 to 20 mPas and most preferably in the range of 1.5 to 15 mPas as determined at a temperature of 25° C. by measuring on AR-G2 rheometer manufactured by TA Instruments. This is measured using a parallel plate geometry as mentioned above.

Preference is furthermore also given to solutions of nonconducting, electronically inert polymers (matrix polymers; inert polymeric binders) which comprise admixed low-molecular-weight, oligomeric, dendritic, linear or branched and/or polymeric organic and/or organometallic semiconductors. Preferably, the formulation may comprise 0.1 to 10% by weight, more preferably 0.25 to 5% by weight and most preferably 0.3 to 3% by weight of inert polymeric binders.

Optionally, the OSC formulation comprises one or more organic binders, preferably polymeric binders to adjust the rheological properties, as described for example in WO 2005/055248 A1, in particular an organic binder which has a low permittivity (∈) at 1,000 Hz of 3.3 or less, in a proportion of binder to OSC compounds from 20:1 to 1:20, preferably 10:1 to 1:10, more preferably 5:1 to 1:5, and most preferably 1:1 to 1:5 by weight.

Surprising effects can be achieved with polymers having a weight average molecular weight of at least 10,000 g/mol, preferably at least 100,000 g/mol, more preferably at least 300,000 g/mol and most preferably at least 500,000 g/mol. According to a very preferred aspect of the present invention, the polymers can preferably have a weight average molecular weigh of at least 1,000,000 g/mol and more preferably at least 2,000,000 g/mol.

The polymers being useful as inert binders can preferably have a weight average molecular weight of at most 30,000, 000 g/mol, more preferably of at most 25,000,000 g/mol and most preferably at most 20,000,000 g/mol.

Preferably, the polymeric binder comprises a weight average molecular weight in the range of 100,000 to 30,000,000 g/mol, more preferably in the range of 300,000 to 25,000, 000 g/mol, and most preferably in the range of 500,000 to 20,000,000 g/mol.

In particular, the polymer can have a polydispersity index $M_w/M_n$ in the range of 1.0 to 10.0, more preferably in the range of 1.0 to 5.0 and most preferably in the range of 1.0 to 3. Astonishing improvements can be achieved with polymers having a polydispersity index $M_w/M_n$ in the range of 1.0 to 2.0, more preferably 1.0 to 1.5 and most preferably 1.0 to 1.2.

According to a special aspect of the present invention, the polymeric binder has a multi modal molecular weight distribution. Preferably, the polymer has 2, 3, 4 or more maxima in the molecular weight distribution as determinable using GPC.

Preferably, the inert binder increases the solvent viscosity of at least 0.4 cps when dissolving 1% w/w of the inert binder in the organic solvent as mentioned above and below. The binder is preferably selected from polystyrene, poly (α-methylstyrene), polyvinylcinnamate, poly(4-vinylbiphenyl) or poly(4-methylstyrene). Polymeric binders preferably comprise repeating units derived from styrene and/or olefins. Preferred polymeric binders can comprise at least 80%, more preferably 90% and most preferably 99% by weight of repeating units derived from styrene monomers and/or olefins.

According to a preferred embodiment of the present invention, an inert binder is a polymer having a glass transition temperature in the range of −70 to 160° C., preferably 0 to 150° C., more preferably 50 to 140° C. and most preferably 70 to 130° C. The glass transition temperature can be determined by measuring the DSC of the polymer (DIN EN ISO 11357, heating rate 10° C. per minute).

Usually, the polymeric binder is dispersible or soluble in the solvent of the present formulation as described above and below. Preferably, the polymeric binder is soluble in the organic solvent and the solubility of the polymeric binder in the solvent is at least 1 g/l, more preferably at least 5 g/l and most preferably at least 10 g/l.

According to a special embodiment of the present invention, the composition of the present invention comprises preferably 0.05 to 10% by weight, more preferably 0.1 to 5% by weight, and most preferably 0.15 to 3% by weight polymeric binder. Astonishing improvements can be achieved by using formulations preferably comprising 0.2 to 1% by weight, more preferably 0.25 to 0.6% by weight and most preferably 0.3 to 0.5% by weight of polymeric binder.

Astonishing improvements can be achieved by using a high molecular weight binder at a low content in the formulation. Using such approach surprisingly efficient devices having an excellent printing quality are obtainable.

The weight ratio of the semiconducting compound to the inert binder is preferably in the range of 30:1 to 1:30, more preferably in the range of 20:1 to 1:5 and most preferably in the range of 5:1 to 1:1, if a binder is used.

According to a special embodiment the polymeric binders preferably comprise repeating units derived from styrene and/or olefins. Preferred polymeric binders comprise at least 80% by weight, more preferably 90% by weight and most preferably 99% by weight of repeating units derived from styrene monomers and/or olefins.

Styrene monomers are well known in the art. These monomers include styrene, substituted styrenes with an alkyl substituent in the side chain, such as α-methylstyrene and α-ethylstyrene, substituted styrenes with an alkyl substituent on the ring such as vinyltoluene and p-methylstyrene, halogenated styrenes such as monochlorostyrenes, dichlorostyrenes, tribromostyrenes and tetrabromostyrenes.

Olefins are monomers consisting of hydrogen and carbon atoms. These monomers include ethylene, propylene, butylenes, isoprene and 1,3-butadiene.

According to a special aspect of the present invention, the polymeric binder is polystyrene having a weight average molecular weight of at least 100,000 g/mol, preferably at least 200,000, more preferably at least 300,000 g/mol and most preferably at least 500,000 g/mol. According to a very preferred aspect of the present invention, the polystyrene preferably has a weight average molecular weight of at least 1,000,000 g/mol and more preferably at least 2,000,000 g/mol.

The polystyrenes being useful as inert binders can preferably have a weight average molecular weight of at most 20,000,000 g/mol, more preferably of at most 12,000,000 g/mol and most preferably of at most 7,000,000 g/mol.

The composition according to the present invention may additionally comprise one or more further components like for example surface-active compounds, lubricating agents, conductive additives, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the OSC or have an electrically doping effect on the OSC.

Surprising improvements can be achieved with volatile wetting agents. The term "volatile" as used above and below means that the agent can be removed from the organic semiconducting materials by evaporation, after these materials have been deposited onto a substrate of an OE device, under conditions (like temperature and/or reduced pressure) that do not significantly damage these materials or the OE device. Preferably this means that the wetting agent has a boiling point or sublimation temperature of ≤350° C., more preferably ≤300° C., most preferably ≤250° C., at the pressure employed, very preferably at atmospheric pressure (1013 hPa). Evaporation can also be accelerated e.g. by applying heat and/or reduced pressure. Preferably, the wetting agents are not capable of chemically reacting with the OSC compounds. In particular they are selected from compounds that do not have a permanent doping effect on the OSC material (e.g. by oxidising or otherwise chemically reacting with the OSC material). Therefore, the formulation preferably should not contain additives, like e.g. oxidants or protonic or lewis acids, which react with the OSC materials by forming ionic products.

Surprising effects can be accomplished by formulations comprising volatile components having similar boiling points. Preferably, the difference of the boiling point of the wetting agent and the organic solvent is in the range of −50° C. to 50° C., more preferably in the range of −30° C. to 30° C. and most preferably in the range of −20° C. to 20° C.

Preferred wetting agents are non-aromatic compounds. With further preference the wetting agents are non-ionic compounds. Particular useful wetting agents comprise a surface tension of at most 35 mN/m, more preferably of at most 30 mN/m, and most preferably at most 25 mN/m. The surface tension can be measured using a FTA (First Ten Angstrom) 1000 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

According to a special aspect of the present invention, the difference of the surface tension of the organic solvent and the wetting agent is preferably at least 1 mN/m, more preferably at least 5 mN/m and most preferably at least 10 mN/m.

Unexpected improvements can be achieved by wetting agents comprising a molecular weight of at least 100 g/mol, preferably at least 150 g/mol, more preferably at least 180 g/mol and most preferably at least 200 g/mol.

Suitable and preferred wetting agents that do not oxidise or otherwise chemically react with the OSC materials are selected from the group consisting of siloxanes, alkanes, amines, alkenes, alkynes, alcohols and/or halogenated derivates of these compounds. Furthermore, fluoro ethers, fluoro esters and/or fluoro ketones can be used. More preferably, these compounds are selected from methyl siloxanes having 6 to 20 carbon atoms, especially 8 to 16 carbon atoms, $C_7$-$C_{14}$ alkanes, $C_7$-$C_{14}$ alkenes, $C_7$-$C_{14}$ alkynes, alcohols having 7 to 14 carbon atoms, fluoro ethers having 7 to 14 carbon atoms, fluoro esters having 7 to 14 carbon atoms and fluoro ketones having 7 to 14 carbon atoms. Most preferred wetting agents are methyl siloxanes having 8 to 14 carbon atoms.

Useful and preferred alkanes having 7 to 14 carbon atoms include heptane, octane, nonane, decane, undecane, dodecane, tridecane, tetradecane, 3-methyl heptane, 4-ethyl heptane, 5-propyl decane, trimethyl cyclohexane and decalin.

Halogenated alkanes having 7 to 14 carbon atoms include 1-chloro heptane, 1,2-dichloro octane, tetrafluoro octane, decafluoro dodecane, perfluoro nonane, 1,1,1-trifluoromethyl decane, and perfluoro methyl decalin.

Useful and preferred alkenes having 7 to 14 carbon atoms include heptene, octene, nonene, 1-decene, 4-decene, undecene, dodecene, tridecene, tetradecene, 3-methyl heptene, 4-ethyl heptene, 5-propyl decene, and trimethyl cyclohexene.

Halogenated alkenes having 7 to 14 carbon atoms include 1,2-dichloro octene, tetrafluoro octene, decafluoro dodecene, perfluoro nonene, and 1,1,1-trifluoromethyl decene.

Useful and preferred alkynes having 7 to 14 carbon atoms include octyne, nonyne, 1-decyne, 4-decyne, dodecyne, tetradecyne, 3-methyl heptyne, 4-ethyl heptyne, 5-propyl decyne, and trimethyl cyclohexyne.

Halogenated alkynes having 7 to 14 carbon atoms include 1,2-dichloro octyne, tetrafluoro octyne, decafluoro dodecyne, perfluoro nonyne, and 1,1,1-trifluoromethyl decyne.

Useful and preferred alcohols having 7 to 14 carbon atoms include, heptanol, octanol, nonanol, decanol, undecanol, dodecanol, tridecanol, tetradecanol, 3-methyl heptanol, 3,5-dimethyl-1-hexyn-3-ol, 4-ethyl heptanol, 5-propyl decanol, trimethyl cyclohexanol and hydroxyl decalin.

Halogenated alcohols having 7 to 14 carbon atoms include 1-chloro heptanol, 1,2-dichloro octanol, tetrafluoro octanol, decafluoro dodecanol, perfluoro nonanol, 1,1,1-trifluoromethyl decanol, and 2-trifluoro methyl-1-hydroxy decalin.

Useful and preferred fluoro ethers having 7 to 14 carbon atoms include 3-ethoxy-1,1,1,2,3,4,4,5,5,6,6,6 dodecafluoro-2-trifluoromethyl-hexane, 3-propoxy-1,1,1,2,3,4,4,5, 5,6,6,6 dodecafluoro-2-trifluoromethyl-hexane, and 3-propoxy-1,1,1,2,3,4,4,5,5,5 decafluoro-2-trifluoromethyl-pentane.

Useful and preferred fluoro esters having 7 to 14 carbon atoms include 3-(1,1,1,2,3,4,4,5,5,6,6,6 dodecafluoro-2-trifluoromethyl-hexyl) ethanoate, and 3-(1,1,1,2,3,4,4,5,5,5 decafluoro-2-trifluoromethyl-pentyl) propanoate.

Useful and preferred fluoro ketones having 7 to 14 carbon atoms include 3-(1,1,1,2,3,4,4,5,5,6,6,6 dodecafluoro-2-trifluoromethyl-hexyl) ethyl ketone, and 3-(1,1,1,2,3,4,4,5,5,5 decafluoro-2-trifluoromethyl-pentyl) propyl ketone.

Useful and preferred siloxanes include hexamethyl disiloxane, octamethyl trisiloxane, decamethyl tetrasiloxane, dodecamethyl pentasiloxane, and tetradecamethyl hexasiloxane.

Preferably, the composition comprises at most 5% by weight, preferably at most 4% by weight of wetting additives. More preferably, the formulation comprises 0.01 to 4% by weight, most preferably 0.1 to 1% by weight of wetting agent.

The composition according to the present invention can be designed as an emulsion, dispersion or solution. Preferably, the present composition is a solution (homogeneous mixture) comprising no considerable amounts of a second phase.

The composition according to the present invention can be used for the preparation of organic electronic (OE) devices, for example transistors like OFETs or organic photovoltaic (OPV) devices like diodes or solar cells, or organic light emitting diodes (OLED).

Preferred OE devices are OFETs. A preferred OFET according to the present invention comprises the following components:
  optionally a substrate (1),
  a gate electrode (2),
  an insulator layer comprising a dielectric material (3),
  an OSC layer (4),
  source and drain electrodes (5), and
  optionally one or more protection or passivation layers (6).

FIG. 1A exemplarily and schematically depicts a typical bottom gate (BG), top contact (TC) OFET device according to the present invention, comprising a substrate (1), a gate electrode (2), a layer of dielectric material (3) (also known as gate insulator layer), an OSC layer (4), and source and drain (S/D) electrodes (5), and an optional passivation or protection layer (6).

The device of FIG. 1A can be prepared by a process comprising the steps of depositing a gate electrode (2) on a substrate (1), depositing a dielectric layer (3) on top of the gate electrode (2) and the substrate (1), depositing an OSC layer (4) on top of the dielectric layer (3), depositing S/D electrodes (5) on top of the OSC layer (4), and optionally depositing a passivation or protection layer (6) on top of the S/D electrodes (5) and the OSC layer (4).

FIG. 1B exemplarily and schematically depicts a typical bottom gate (BG), bottom contact (BC) OFET device according to the present invention, comprising a substrate (1), a gate electrode (2), a dielectric layer (3), S/D electrodes (5), an OSC layer (4), and an optional passivation or protection layer (6).

The device of FIG. 1B can be prepared by a process comprising the steps of depositing a gate electrode (2) on a substrate (1), depositing a dielectric layer (3) on top of the gate electrode (2) and the substrate (1), depositing S/D electrodes (5) on top of the dielectric layer (3), depositing an OSC layer (4) on top of the S/D electrodes (4) and the dielectric layer (3), and optionally depositing a passivation or protection layer (6) on top of the OSC layer (4).

FIG. 2 exemplarily and schematically depicts a top gate (TG) OFET device according to the present invention, comprising a substrate (1), source and drain electrodes (5), an OSC layer (4), a dielectric layer (3), and a gate electrode (2), and an optional passivation or protection layer (6).

The device of FIG. 2 can be prepared by a process comprising the steps of depositing S/D electrodes (5) on a substrate (1), depositing an OSC layer (4) on top of the S/D electrodes (4) and the substrate (1), depositing a dielectric layer (3) on top of the OSC layer (4), depositing a gate electrode (2) on top of the dielectric layer (3), and optionally depositing a passivation or protection layer (6) on top of the gate electrode (2) and the dielectric layer (3).

The passivation or protection layer (6) in the devices described in FIGS. 1A, 1B and 2 has the purpose of protecting the OSC layer and the S/D or gate electrodes from further layers or devices that may be later provided thereon, and/or from environmental influence.

The distance between the source and drain electrodes (5), as indicated by the double arrow in FIGS. 1A, 1B and 2, is the channel area.

In case of formulations for use in OPV cells, the formulation preferably comprises or contains, more preferably consists essentially of, most preferably exclusively consists of, a p-type semiconductor and a n-type semiconductor, or an acceptor and a donor material. A preferred material of this type is a blend or mixture of poly(3-substituted thiophene) or P3AT with a $C_{60}$ or $C_{70}$ fullerene or modified $C_{60}$ molecule like PCBM [(6,6)-phenyl C61-butyric acid methyl ester], as disclosed for example in WO 94/05045 A1, wherein preferably the ratio of P3AT to fullerene is from 2:1 to 1:2 by weight, more preferably from 1.2:1 to 1:1.2 by weight.

FIG. 3 and FIG. 4 exemplarily and schematically depict typical and preferred OPV devices according to the present invention [see also Waldauf et al., Appl. Phys. Lett. 89, 233517 (2006)].

An OPV device as shown in FIG. 3 preferably comprises:
  a low work function electrode (31) (for example a metal, such as aluminum), and a high work function electrode (32) (for example ITO), one of which is transparent,
  a layer (33) (also referred to as "active layer") comprising a hole transporting material and an electron transporting material, preferably selected from OSC materials, situated between the electrodes (31,32); the active layer can exist for example as a bilayer or two distinct layers or blend or mixture of p and n type semiconductor,
  an optional conducting polymer layer (34), for example comprising a blend of PEDOT:PSS (poly(3,4-ethylenedioxythiophene): poly(styrenesulfonate)), situated between the active layer (33) and the high work function electrode (32), to modify the work function of the high work function electrode to provide an ohmic contact for holes,
  an optional coating (35) (for example of LiF) on the side of the low workfunction electrode (31) facing the active layer (33), to provide an ohmic contact for electrons.

An inverted OPV device as shown in FIG. 4 preferably comprises:
  a low work function electrode (41) (for example a metal, such as gold), and a high work function electrode (42) (for example ITO), one of which is transparent,
  a layer (43) (also referred to as "active layer") comprising a hole transporting material and an electron transporting material, preferably selected from OSC materials, situated between the electrodes (41,42); the active layer can exist for example as a bilayer or two distinct layers or blend or mixture of p and n type semiconductor, an optional conducting polymer layer (44), for example comprising a blend of PEDOT:PSS, situated between the active layer (43) and the low work function electrode (41) to provide an ohmic contact for electrons, an optional coating (45) (for example of $TiO_x$) on the side of the high workfunction electrode (42) facing the active layer (43), to provide an ohmic contact for holes.

The OPV devices of the present invent invention typically may comprise a p-type (electron donor) semiconductor and a n-type (electron acceptor) semiconductor. Preferably, the p-type semiconductor is for example a polymer like poly(3-alkyl-thiophene) (P3AT), preferably poly(3-hexyl-thiophene) (P3HT), or alternatively another selected from the groups of preferred polymeric and monomeric OSC material as listed above. The n-type semiconductor can be an inorganic material such as zinc oxide or cadmium selenide, or an organic material such as a fullerene derivate, for example (6,6)-phenyl $C_{61}$-butyric acid methyl ester, also known as "PCBM" or "$PC_{61}BM$", as disclosed for example in G. Yu, J. Gao, J. C. Hummelen, F. Wudl, A. J. Heeger, Science 1995, Vol. 270, p. 1789 ff and having the structure shown below, or an structural analogous compound with e.g. a $C_{71}$ fullerene group ($PC_{71}BM$), or a polymer (see for example Coakley, K. M. and McGehee, M. D. *Chem. Mater.* 2004, 16, 4533).

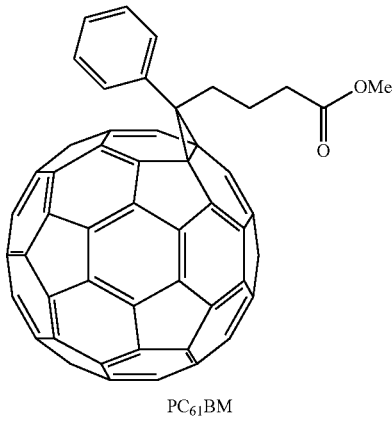 [SMILES: COC(=O)CCCC1(c2ccccc2)C23C=C4Cc5cc6cc7c8c9c(cc%10cc%11c%12c(c%13c%14c%15c(c4c5c4c6c8c(c%154)c4c9c%10c%12c%144)C%1321)C(=C3)C%11)C7]

$PC_{61}BM$

A preferred material of this type is a blend or mixture of a polymer like P3HT or another polymer selected from the groups listed above, with a $C_{60}$ or $C_{70}$ fullerene or modified $C_{60}$ fullerene like $PC_{61}BM$ or $PC_{71}BM$. Preferably the ratio polymer:fullerene is from 2:1 to 1:2 by weight, more preferably from 1.2:1 to 1:1.2 by weight, most preferably 1:1 by weight. For the blended mixture, an optional annealing step may be necessary to optimize blend morpohology and consequently OPV device performance.

During the process of preparing an OE device, the OSC layer is deposited onto a substrate, followed by removal of the solvent together with any volatile additive(s) present, to form a film or layer.

Various substrates may be used for the fabrication of OE devices, for example glass, ITO coated glass, ITO glass with pre coated layers including PEDOT, PANI etc, or plastics, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetra-fluoroethylene, fiber glass enhanced plastic, fluorocarbon polymers, hexafluoropropylenevinylidene-fluoride copolymer, high density polyethylene, parylene, polyamide, polyimide, polyaramide, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones, and flexible films with ITO, or other conducting layers and barrier layers e.g. Vitex film.

Preferred substrate materials are polyethyleneterephthalate, polyimide, and polyethylenenaphthalate. The substrate may be any plastic material, metal or glass coated with the above materials. The substrate should preferably be homogeneous to ensure good pattern definition. The substrate may also be uniformly pre-aligned by extruding, stretching, rubbing or by photo-chemical techniques to induce the orientation of the organic semiconductor in order to enhance carrier mobility.

The electrodes can be deposited by liquid coating, such as spray-, dip-, webor spin-coating, or by vacuum deposition or vapor deposition methods. Suitable electrode materials and deposition methods are known to the person skilled in the art. Suitable electrode materials include, without limitation, inorganic or organic materials, or composites of the two. Examples for suitable conductor or electrode materials include polyaniline, polypyrrole, PEDOT or doped conjugated polymers, further dispersions or pastes of graphite or particles of metal such as Au, Ag, Cu, Al, Ni or their mixtures as well as sputter coated or evaporated metals such as Cu, Cr, Pt/Pd or metal oxides such as indium tin oxide (ITO). Organometallic precursors may also be used deposited from a liquid phase.

Preferably, the substrate on surface on which the formulation according to the present invention is applied comprises a surface energy in the range of 130 to 25 mN m$^{-1}$ and more preferably in the range of 115 to 30 mN m$^{-1}$ determined by measuring the contact angle of at least 2 solvents, e.g. water and methylene iodide, but other solvents can be used. These are typically measured using a contact angle goniometer such as a FTA 1000, at a temperature of 20 to 25° C. (room temperature and at normal atmospheric pressure) the contact angle of the 2 solvents are then combined using a variety of mathematical models, typically Owens-Wendt geometric mean or Wu's harmonic mean. Preferably, the Owens-Wendt method is used.

$(1+\cos\theta)\gamma LV = 2\sqrt{(\gamma^P SV \gamma^P LV)} + 2\sqrt{(\gamma^P SV \gamma^P LV)}$   Owens-Wendt Formula:

$(1+\cos\theta)\gamma LV = 4\{\gamma DSV \gamma DLV/(\gamma^P SV + \gamma^P LV) + \gamma^P SV \gamma^P LV/(\gamma^P SV + \gamma^P LV)\}$   Wu's Harmonic Mean Formula:

Deposition of the OSC layer can be achieved by standard methods that are known to the skilled person and are described in the literature. Suitable and preferred deposition methods include liquid coating and printing techniques.

Very preferred deposition methods include, without limitation, dip coating, spin coating, spray coating, aerosol jetting, ink jet printing, nozzle printing, gravure printing, doctor blade coating, roller printing, reverse-roller printing, flexographic printing, web printing, spray coating, dip coating, curtain coating, kiss coating, meyer bar coating, 2 roll nip fed coating, anilox coaters, knife coating or slot dye coating. Preferably, the OSC layer is applied with gravure printing, doctor blade coating, roller printing, reverse-roller printing, flexographic printing, web printing, anilox coaters. Gravure, flexographic and inkjet printing and variants of these printing methods are preferred. These include but are not limited to, micro gravure, reverse gravure, offset gravure, reverse roll etc. Both web fed (roll to roll) and sheetfed in both flatbed and the more conventional 'on the round' configurations can be used.

For flexo printing the anilox can be either chromed steel or ceramic, preferably ceramic. The cell etch can vary between 2 cm$^3$/m$^2$ to 120 cm$^3$/m$^2$ but more preferably between 3 cm$^3$/m$^2$ to 20 cm$^3$/m$^2$ and most preferably between 4 cm$^3$/m$^2$ to 18 cm$^3$/m$^2$, however the dried film thickness will vary on the concentration of the active material and the transfer characteristics of said formulation.

The cell configuration, i.e. shape, depth, cell wall linking can be adapted by a person skilled in the art to achieve an optimal printing result.

For gravure printing the chromed steel is preferably used but this does not exclude other materials. The engraving requirements are approximately 50% of those for the flexographic printing because there is one less transfer process involved.

The speed can vary significantly depending on the press type and configuration, for flatbed printing the print speed is typically very slow, typically 100 mm/minute or less. On roll to roll presses the speed can exceed 500 m/minute.

According to a special aspect, an insulator layer can be deposited on a substrate in order to achieve a special type of an OE according to the present invention. Preferably, the insulator layer is deposited by solution processing, more preferably using a solution of a dielectric material, which is optionally cross-linkable, in one or more organic solvents. Preferably the solvent used for depositing the dielectric material is orthogonal to the solvent used for depositing the OSC material, and vice versa.

When spin coating is used as deposition method, the OSC or dielectric material is spun for example between 1000 and 2000 rpm for a period of for example 30 seconds to give a layer with a typical layer thickness between 0.5 and 1.5 µm. After spin coating the film can be heated at an elevated temperature to remove all residual volatile solvents.

If a cross-linkable dielectric is used, it is preferably cross-linked after deposition by exposure to electron beam or electromagnetic (actinic) radiation, like for example X-ray, UV or visible radiation. For example, actinic radiation can be used having a wavelength of from 50 nm to 700 nm, preferably from 200 nm to 450 nm, more preferably from 300 nm to 400 nm. Suitable radiation dosages are typically in the range from 25 to 3,000 mJ/cm$^2$. Suitable radiation sources include mercury, mercury/xenon, mercury/halogen and xenon lamps, argon or xenon laser sources, x-ray, or e-beam. The exposure to actinic radiation will induce a cross-linking reaction in the cross-linkable groups of the dielectric material in the exposed regions. It is also possible for example to use a light source having a wavelength outside the absorption band of the cross-linkable groups, and to add a radiation sensitive photosensitizer to the cross-linkable material.

Optionally the dielectric material layer is annealed after exposure to radiation, for example at a temperature from 70° C. to 130° C., for example for a period of from 1 to 30 minutes, preferably from 1 to 10 minutes. The annealing step at elevated temperature can be used to complete the cross-linking reaction that was induced by the exposure of the cross-linkable groups of the dielectric material to photoradiation.

Removal of the solvent and any volatile additive(s) is preferably achieved by evaporation, for example by exposing the deposited layer to high temperature and/or reduced pressure, preferably at −50° C. to 300° C., more preferably 20° C. to 250° C. According to a special aspect of the present invention, the solvent(s) and any volatile additive can be evaporated under reduced pressure. Preferably either atmospheric pressure or reduced pressure the pressure for solvent evaporation ranges preferably from 10$^{-3}$ mbar to 1 bar, more preferably from 10$^{-2}$ mbar to 100 mbar and most preferably from 0.1 mbar to 10 mbar. Moreover, the evaporation of the solvent can be preferably achieved below the boiling point of the solvent.

The thickness of the dried OSC layer is preferably from 1 nm to 50 µm, more preferably from 2 to 1000 nm and most preferably from 3 to 500 nm. Preferred layers comprising organic light emitting materials and/or charge transporting materials have a thickness in the range from 2 to 150 nm.

Further to the materials and methods as described above and below, the OE device and its components can be prepared from standard materials and standard methods, which are known to the person skilled in the art and described in the literature.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include oligomers and dendrimers.

Dendrimers are typically branched macromolecular compounds consisting of a multifunctional core group onto which further branched monomers are added in a regular way giving a tree-like structure, as described e.g. in M. Fischer and F. Vogtle, *Angew. Chem., Int. Ed.* 1999, 38, 885.

The term "conjugated polymer" means a polymer containing in its backbone (or main chain) mainly C atoms with sp$^2$-hybridisation, or optionally sphybridisation, which may also be replaced by hetero atoms, enabling interaction of one π-orbital with another across an intervening σ-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring ring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with $sp^2$-hybridisation or sphybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n=M_n/M_U$, wherein $M_U$ is the molecular weight of the single repeating unit.

The term "small molecule" means a monomeric, i.e. a non-polymeric compound.

Unless stated otherwise, percentages of solids are percent by weight ("wt. %"), percentages or ratios of liquids (like e.g. in solvent mixtures) are percent by volume ("vol. %"), and all temperatures are given in degrees Celsius (° C.).

Unless stated otherwise, concentrations or proportions of mixture components, given in percentages or ppm are related to the entire formulation including the solvents.

All process steps described above and below can be carried out using known techniques and standard equipment which are described in the prior art and are well-known to the skilled person.

The invention will now be described in more detail by reference to the following examples, which are illustrative only and do not limit the scope of the present invention.

Example 1

A printing ink was prepared by the following procedure.
0.03 g of a polymer of the following formula was weighted into a glass vial.

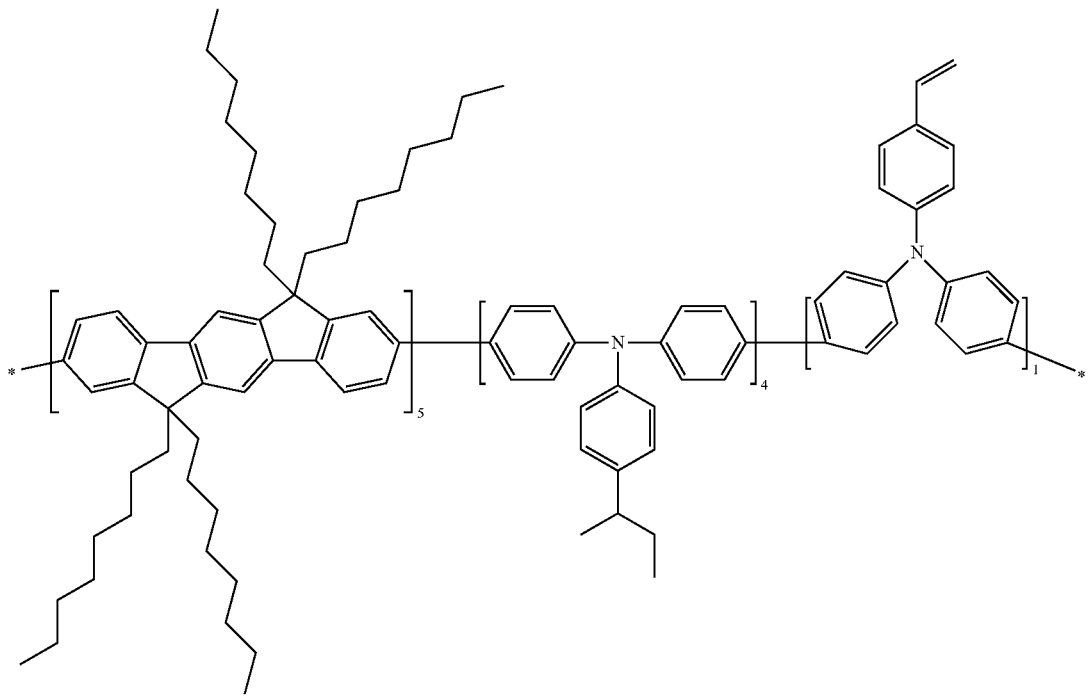

To this 3 ml of 3,4-dimethyl anisole was added. A small magnetic stirrer bar was added and the glass vial was sealed. This was warmed to ~35 to 40° C. and stirred for 2 hours to ensure complete dissolution of the solid materials. After dissolving the lid was removed and helium was bubbled through for 20 minutes in order to de-gas, after this the container was placed in a vacuum desicator and left overnight to remove the Helium.

2 ml of the ink was filtered using a 0.45μ filter (25 mm diameter ex Millipore) into a LCP cartridge for use with a Dimatix DMP2831 printer. The head of the cartridge was put into position and then inserted into the ink-jet printer.

A full ink jet test was performed to assess the print performance of the ink, ink-jet behaviour was observed and commented on. Ink-jet waveform was optimised, and the effects of changing the voltage/frequency and pulse width on droplet velocity were also assessed.

The prepared ink was printed onto a 25 mm×25 mm glass slide that was cleaned by placing in methanol in an ultrasonic bath for 10 minutes at 70° C. After this the methanol was dried off and the substrate was placed on to a hot plate set at 150° C. for 15 minutes. The glass slide was removed and a preparation of PEDOT was spin coated onto the slide at a speed of 1000 rpm to give a final PEDOT coating thickness of 100 nm.

The ink was printed using a 2 mm×2 mm square pattern; this was printed at 20μ, 40μ, 60μ, 80μ and 100μ drop spacing (ds), the different drop spacings were achieved by angulating the printing head. The printing was performed at different temperatures namely 25° C., 30° C., 40° C., 50° C. and 60° C.

The jetting stability was good. Nozzle plate wetting was good (none). The prepared ink gave acceptable wetting over the PEDOT between 20µ to 80µ ds. The printing quality was good or at least acceptable for 20µ to 60µ ds depending on the printing temperature. The jetting stability was good. The coalescence distance was 400 µm.

Comparative Example 1

Essentially, Example 1 was repeated. However, anisole has been used as solvent. The ink was printed using a 2 mm×2 mm square pattern; this was printed at 20µ, 40µ, 60µ, 80µ and 100µ drop spacing (ds), the different drop spacings were achieved by angulating the printing head. The printing was performed at 25° C.

The jetting stability was poor. Nozzle plate wetting was moderate. The coalescence distance was 370 µm. The anisole based ink did not wet the PEDOT coated substrate well, the swaths did not merge when using 60µ, 80µ and 100µ ds. The printing performed better using 20µ ds and 40µ, with better wetting but drying fronts seen on the film and significant coffee staining is evident.

Example 2

Essentially, Example 1 was repeated. However, 4-methyl anisole has been used as solvent. The ink was printed using a 2 mm×2 mm square pattern; this was printed at 20µ, 40µ, 60µ, 80µ and 100µ drop spacing (ds), the different drop spacings were achieved by angulating the printing head. The printing was performed at 25° C.

The jetting stability was good. Nozzle plate wetting was slight. The coalescence distance was 350 µm. The PEDOT layer was wetted acceptable for 20µ to 60µ ds. The printing quality was good or at least acceptable for 60 µds. However, the results of Example 1 are better with regard to 40 and 80µ ds.

Example 3

Essentially, Example 1 was repeated. However, 2,4-dimethyl anisole has been used as solvent. The ink was printed using a 2 mm×2 mm square pattern; this was printed at 20µ, 40µ, 60µ, 80µ and 100µ drop spacing (ds), the different drop spacings were achieved by angulating the printing head. The printing was performed at 25° C.

The jetting stability was good. Nozzle plate wetting was slight. The coalescence distance was 420 µm. The PEDOT layer was wetted acceptable for 20µ to 80µ ds. The printing quality was good or at least acceptable for 40 and 60µ ds. However, the results of Example 1 are better with regard to 80µ ds.

Example 4

Essentially, Example 1 was repeated. However, 2,5-dimethyl anisole has been used as solvent. The ink was printed using a 2 mm×2 mm square pattern; this was printed at 20µ, 40µ, 60µ, 80µ and 100µ drop spacing (ds), the different drop spacings were achieved by angulating the printing head. The printing was performed at 25° C.

The jetting stability was good. Nozzle plate wetting was slight. The coalescence distance was 410 µm. On the PEDOT layer no acceptable film was formed for 20µ to 60µ ds. At 80µ and 100µ ds a better film can be seen. However, the swathes did not merge.

Example 5

Essentially, Example 1 was repeated. However, 2,6-dimethyl anisole has been used as solvent. The ink was printed using a 2 mm×2 mm square pattern; this was printed at 20µ, 40µ, 60µ, 80µ and 100µ drop spacing (ds), the different drop spacings were achieved by angulating the printing head. The printing was performed at 25° C.

The jetting stability was good. Nozzle plate wetting was slight. The coalescence distance was 380 µm. The 2,6-dimethyl anisole based ink did not wet the PEDOT coated substrate well, the swaths did not merge when using 40µ, 60µ, 80µ and 100µ ds. The printing performed better using 20µ ds with better wetting but drying fronts seen on the film and significant coffee staining is evident.

The invention claimed is:

1. A composition comprising one or more organic semiconducting compounds (OSC) having a molecular weight of at least 10,000 g/mol, and one or more organic solvents, wherein said organic solvent comprises a mono- or di($C_1$-$C_5$-alkyl)anisole, wherein said semiconducting compound (OSC) having a molecular weight of at least 10,000 g/mol contains at least one structural unit selected from the group consisting of triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O, S or N containing heterocycles having an HOMO in the polymer of greater than −5.8 eV, or wherein said semiconducting compound (OSC) having a molecular weight of at least 10,000 g/mol contains at least one structural unit selected from the group consisting of pyridine, pyrimidine, pyridazine, pyrazine, oxadiazole, quinoline, quinoxaline, anthracene, benzanthracene, pyrene, perylene, benzimidazole, triazine, ketone, phosphine oxide, phenazine derivatives, and triarylboranes and further O, S or N containing heterocycles having an LUMO of less than −1.9 eV, or wherein said semiconducting compound (OSC) having a molecular weight of at least 10,000 g/mol contains at least one structural unit selected from the group consisting of 4,5-dihydropyrene, 4,5,9,10-tetrahydropyrene, fluorene, 9,9'-spirobifluorene, phenanthrene, 9,10-dihydro-phenanthrene, 5,7-dihydrodibenzoxepine, cis- and trans-indenofluorene and derivatives thereof, and wherein the composition comprises a viscosity at 25° C. in the range of 1.0 to 100 mPas.

2. The composition according to claim 1, wherein said organic solvent comprises a di($C_1$-$C_3$-alkyl)anisole.

3. The composition according to claim 1, wherein said organic solvent comprises a dimethylanisole.

4. The composition according to claim 1, wherein said organic solvent comprises a 3,4-dimethylanisole.

5. The composition according to claim 4, wherein said organic solvent comprises at least 60% by weight 3,4-dimethylanisole.

6. The composition according to claim 1, wherein said organic solvent comprises at least one further compound.

7. The composition according to claim 6, wherein said further compound of said solvent comprises at most 40% by weight of said further compound.

8. The composition according to claim 1, wherein said composition comprises in the range of 0.1 to 10% by weight of organic semiconducting compounds.

9. The composition according to claim 1, wherein said composition comprises at least one wetting agent.

10. The composition according to claim 1, wherein said composition comprises at least one inert binder.

11. The composition according to claim 1, wherein said semiconducting compound (OSC) having a molecular weight of at least 10,000 g/mol comprises at least one structural unit being a triplet emitter unit.

12. A coating or a printing ink for the preparation of an organic electronic (OE) device which comprises the composition according to claim 1.

13. A process of preparing an organic electronic (OE) device, comprising the steps of
   a) depositing the composition according to claim 1 onto a substrate to form a film or layer, and
   b) removing the solvent(s).

14. The process according to claim 13, wherein the composition is applied by dip coating, spin coating, ink jet printing, nozzle printing, letter-press printing, screen printing, gravure printing, doctor blade coating, roller printing, reverse-roller printing, offset lithography printing, flexographic printing, web printing, spray coating, dip coating, curtain coating, brush coating, slot dye coating or pad printing.

15. An organic electronic (OE) device prepared from the composition according to claim 1.

16. An organic electronic (OE) device prepared by the process according to claim 13.

* * * * *